(12) United States Patent  
Carey (10) Patent No.: US 6,215,302 B1  
(45) Date of Patent: Apr. 10, 2001

(54) PREAMPLIFIER AND METHOD FOR MEASURING RESISTANCE OF A RESISTIVE TRANSDUCER

(75) Inventor: Brian Robert Carey, Cupertino, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/304,978

(22) Filed: May 4, 1999

(51) Int. Cl.[7] .................................................. G01R 33/02
(52) U.S. Cl. ............................................. 324/252; 360/67
(58) Field of Search ........................... 324/207.21, 252, 324/260, 263, 249; 338/32 R; 360/313, 328, 67, 66, 68, 46

(56) References Cited

U.S. PATENT DOCUMENTS

| | | | |
|---|---|---|---|
| 4,691,259 | 9/1987 | Imakoshi et al. | 360/113 |
| 4,786,993 | * 11/1988 | Jove et al. | 360/67 |
| 5,204,789 | * 4/1993 | Jove et al. | 360/67 |
| 5,561,366 | 10/1996 | Takahashi et al. | 324/117 R |

OTHER PUBLICATIONS

Steinman, Arnold "ESD Control for Magneto–Resistive Heads Part I: Static Charge Issues in Disk Drive," www.semiconductoronline.com, Nov. 13, 1998, 5 pages.

"Magneto–Resistive Head Technical Fact Sheet," www.seagate.com, Jun. 12, 1998 SD, 2 pages.

* cited by examiner

*Primary Examiner*—Jay Patidar  
(74) *Attorney, Agent, or Firm*—Limbach & Limbach L.L.P.

(57) ABSTRACT

A preamplifier for a resistive transducer, configured to generate an amplified output indicative of potential difference across the transducer (while the transducer is biased and in the presence of a magnetic field) and to generate a resistance signal indicative of the transducer's resistance, and a method for measuring the resistance of a resistive transducer during operation of the transducer in the presence of a changing magnetic field. The preamplifier preferably includes circuitry for generating a current signal indicative of the instantaneous current through the transducer and analog divider circuitry for generating the resistance signal from a signal indicative of the potential difference across the transducer and the current signal. When the resistance signal is an analog signal, the preamplifier can include circuitry for processing the analog resistance signal to generate a word of binary data indicative of a value proportional to the transducer resistance. Alternatively, when the resistance signal is an analog signal the preamplifier can include a digital-to-analog (D-to-A) converter, and a comparator which receives an analog resistance signal and the output of the D-to-A converter. In operation of the latter class of embodiments, the output of the D-to-A converter is swept until the comparator is tripped, at which time the setting of the D-to-A converter is proportional to the transducer resistance.

26 Claims, 8 Drawing Sheets

PREAMPLIFIER AND METHOD FOR MEASURING RESISTANCE OF A RESISTIVE TRANSDUCER

FIELD OF THE INVENTION

The invention pertains to preamplifiers for resistive transducers (such as a magneto-resistive transducers), and to methods for measuring the resistance of a resistive transducer. In preferred embodiments, the inventive preamplifier includes circuitry for measuring resistance of a resistive transducer (as well as potential difference across the transducer) during normal transducer operation.

BACKGROUND OF THE INVENTION

When positioned in an external magnetic field, the resistance of a magneto-resistive transducer varies in response to variations of the magnetic field over time. Magneto-resistive transducers have been used as read heads in magnetic disk drives and are being more commonly used for this purpose.

A typical magneto-resistive transducer includes a strip of nickel-iron metallization on a silicon substrate. A preamplifier coupled to the strip applies a bias voltage across the strip (to cause current flow through the strip), and while doing so generates an amplified signal indicative of the potential difference across the strip. The amplified signal then undergoes further processing.

Figure 1:
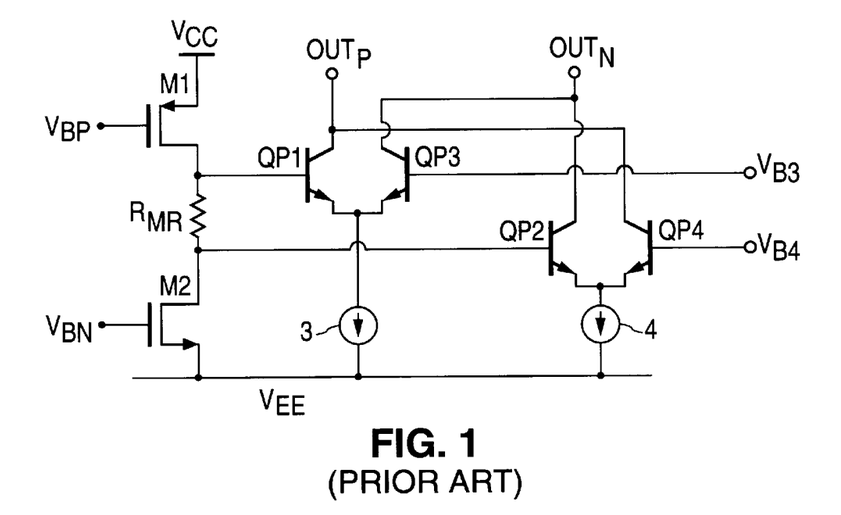
FIG. 1 is a schematic diagram of a portion of a conventional preamplifier circuit connected to a magneto-resistive transducer.
Figure 1A:
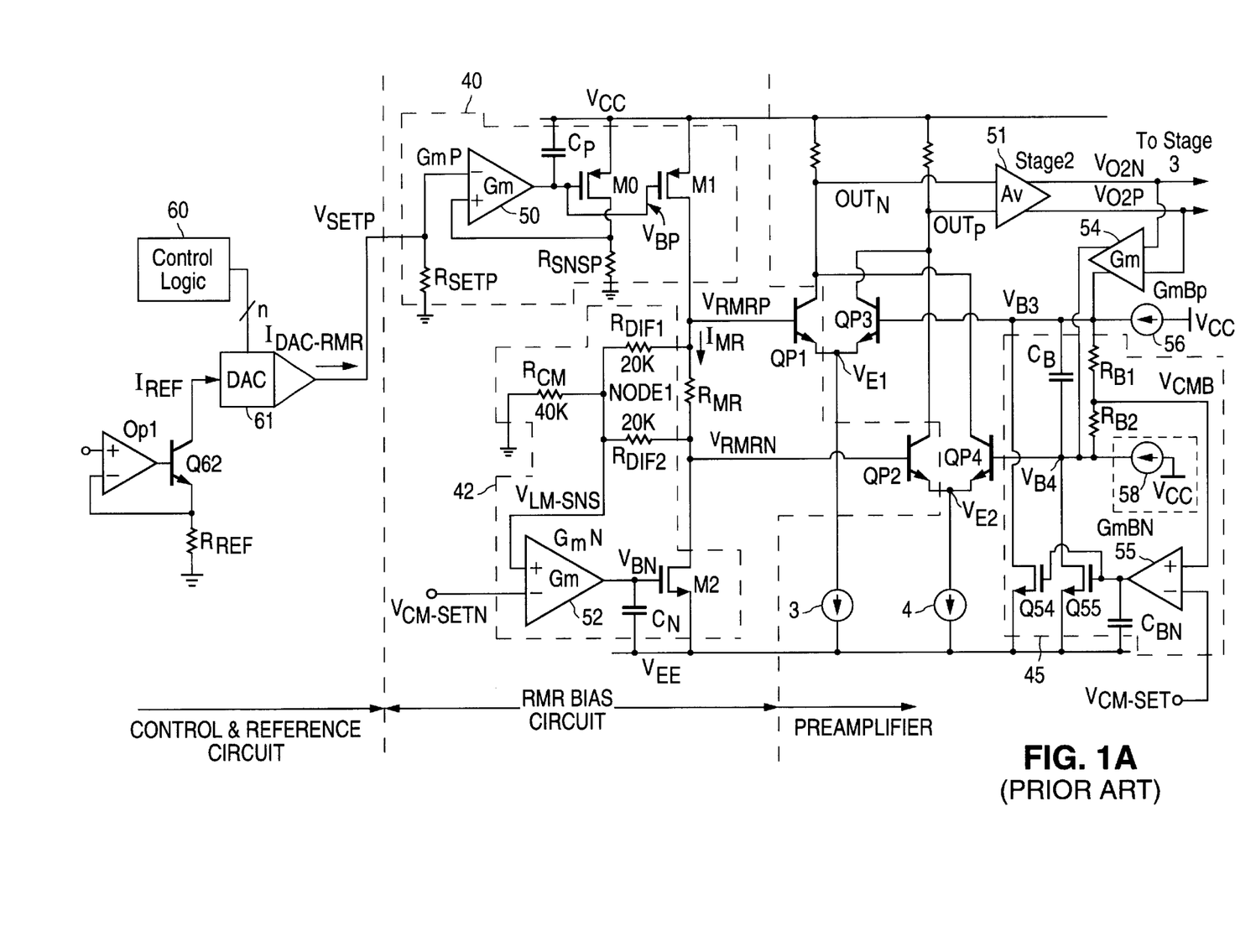
FIG. 1A is a schematic diagram of a conventional preamplifier circuit connected to a magneto-resistive transducer.

A typical preamplifier of this type is shown in FIG. 1A, and a portion of the FIG. 1A circuit is shown in FIG. 1. In FIG. 1, the magneto-resistive transducer is represented as a resistor having resistance $R_{MR}$. The drain of PMOS transistor M1 is coupled to one end of the transducer, the source of M1 is coupled to the top rail (at potential $V_{CC}$), the drain of NMOS transistor M2 is coupled to the other end of the transducer, and the source of M2 is coupled to the bottom rail (at potential $V_{EE}$). The transducer is biased by asserting bias potentials $V_{BP}$ and $V_{BN}$ to the gates of transistors M1 and M2, thereby applying a bias potential across the transducer and causing current $I_{MR}$ to flow through the transducer (and through transistors M1 and M2). The magnitudes of the bias potentials $V_{BP}$ and $V_{BN}$ are chosen as a function of the transducer resistance (e.g., the transducer resistance in the presence of no magnetic field) and other factors to optimize system performance.

The potential difference ($V_{MR}$) across the transducer is amplified to generate differential output $OUT_P$, $OUT_N$ (indicative of the potential difference across the transducer), by an amplifier comprising NPN bipolar transistors $Q_{P1}$ and $Q_{P2}$ (whose bases are coupled to opposite ends of the transducer), NPN bipolar transistors $Q_{P3}$ and $Q_{P4}$ (whose bases are coupled to receive bias voltages VB3 and VB4), current source 3 coupled to the common emitters of transistors $Q_{P1}$ and $Q_{P3}$, and current source 4 coupled to the common emitters of transistors $Q_{P2}$ and $Q_{P4}$. The output signal $OUT_P$, $OUT_N$ is produced at the collectors of transistors $Q_{P1}$ and $Q_{P2}$.

With reference to FIG. 1A, we next describe typical circuitry for producing the above-mentioned bias potentials $V_{BP}$, $V_{BN}$, $V_{B3}$, and $V_{B4}$ which are employed in FIG. 1.

In FIG. 1A, circuit 40 (which includes above-discussed transistor M1) is a current source which is biased, by potential $V_{SETP}$ asserted at the output of digital-to-analog converter 61, to function as the source of the current $I_{MR}$ which flows through transducer $R_{MR}$.

Op amp 62, NPN bipolar transistor Q62, and resistor $R_{REF}$ (connected as shown in FIG. 1A) provide reference current $I_{REF}$ to digital-to-analog converter ("DAC") 61, when reference potential $V_{REF}$ is asserted at the noninverting input of op amp 62. To control the output of DAC 61, control logic 60 asserts control bits to DAC 61. In response to the control bits and reference current $I_{REF}$ the output of DAC 61 is at the potential $V_{SETP}$ (and circuit 40 draws current $I_{DAC-RMR}$ therefrom). In response to potential $V_{SETP}$, circuit 40 maintains the gate of transistor M1 at a desired bias potential $V_{BP}$.

More specifically, circuit 40 includes PMOS transistors M0 and M1 and capacitor $C_P$ (connected as shown in FIG. 1A), transconductance amplifier 50 (whose inverting input is coupled to the output of DAC 61 and whose noninverting input is coupled to the drain of transistor M0), resistor $R_{SETP}$ (coupled between ground and the inverting input of amplifier 50), and resistor $R_{SNSP}$ (coupled between the drain of M0 and ground). The gates of transistors M1 and M0 are coupled to the output of amplifier 50, so that the output potential of amplifier 50 is the bias potential $V_{BP}$ for the gate of transistor M1. Since transistor M0 has characteristics which match those of transistor M1, the current at the drain of M0 is proportional (with a known proportionality factor) to the current at the drain of M1, and the noninverting terminal of amplifier 50 thus receives feedback (from the drain of transistor M0) indicative of the drain current of transistor M1. In response to this feedback, amplifier 50 maintains the bias potential $V_{BP}$ at a level, determined by the reference potential $V_{SETP}$, which will maintain the current through the transducer at a desired nominal level.

Circuit 42 includes NMOS transistor M2, capacitor $C_N$, and resistors $R_{CM}$, $R_{DIF1}$, and $R_{DIF2}$ connected as shown in FIG. 1A (with $R_{CM}$ connected between ground and Node 1, $R_{DIF1}$ connected between one end of the transducer and Node 1, and $R_{DIF2}$ connected between the other end of the transducer and Node 1), and transconductance amplifier 52 whose inverting input is coupled to receive bias potential $V_{CM-SETN}$. The noninverting input of amplifier 52 is coupled to Node 1, and thus is maintained at a potential (above ground) equal to the common mode voltage of the transducer, $(V_{RMRP}+V_{RMRN})/2$, where $V_{RMRP}-V_{RMRN}$ is the voltage across the transducer (since $R_{DIF1}=R_{DIF2}$ $R_{CM}/2$, with $R_{DIF1}$ typically equal to 20 KOhms). Thus, amplifier 52 (whose output is coupled to the gate of transistor M2) forces the gate of M2 to remain at a bias potential $V_{BN}$, determined by the reference potential $V_{CM-SETN}$, which will maintain the common mode voltage of the transducer at a desired level (typically at or near ground potential).

Still with reference to FIG. 1A, the abovediscussed differential output $OUT_P$, $OUT_N$ of the FIG. 1 circuit (which is indicative of the potential difference across the transducer and is produced at the collectors of transistors $Q_{P1}$ and $Q_{P2}$) undergoes amplification in second stage amplifier 51. The resulting amplified differential output ($V_{o2N}$, $V_{o2P}$) is asserted to a third stage (not shown).

The amplified differential output ($V_{o2N}$, $V_{o2P}$) is also asserted to the inputs of transconductance amplifier 54. In response, transconductance amplifier 54 asserts a first output having potential $V_{B3}$ to the base of transistor $Q_{P3}$ and a second output having potential $V_{B4}$ to the base of transistor $Q_{P4}$. Current source 56 is coupled between the base of transistor $Q_{P3}$ and the top rail, and current source 58 is coupled between the base of transistor $Q_{P4}$ and the top rail, as shown. Thus, amplifier 54 determines the difference between bias potentials $V_{B3}$ and $V_{B4}$. Circuit 45 (which includes transconductance amplifier 55) sets the common mode voltage $V_{B3}+V_{B4})/2$ to an appropriate level determined by bias potential $V_{CM-SET}$ (which is asserted to the inverting input of transconductance amplifier 55). The noninverting input of transconductance amplifier 55 is coupled between resistors $R_{B1}$ and $R_{B2}$, and resistors $R_{B1}$ and $R_{B2}$ are connected in series between the base of $Q_{P3}$ and the base of $QP_4$. The output of amplifier 55 is connected to the common gates of NMOS transistors Q54 and Q55. The drain of Q55 is coupled to the base of $Q_{P4}$, and capacitor $C_B$ is coupled between the base of $Q_{P3}$ and the base of $Q_{P4}$. Capacitor $C_{BN}$ is coupled between the output of amplifier 55 and the bottom rail.

It is well known that any of many different architectures are possible for implementing a preamplifier for a magneto-resistive transducer (e.g., the transducer shown in FIG. 1A whose resistance is $R_{MR}$). All the architectures (including that of FIG. 1A) must perform the following functions: generate an appropriate bias current through the transducer; maintain the common mode voltage of the transducer ((V2+V1)/2, where V2−V1 is the voltage across the transducer) at an appropriate level to prevent electrical discharge to the disk (or other object being sensed) and to allow voltage headroom (source-to-drain or collector-to-emitter voltage) for the various current source and amplifier transistors; and bias the amplifier transistors at appropriate voltages to sense and amplify the differential voltage across the transducer while minimizing the d.c. or low frequency component of the preamplifier's differential output voltage.

Although the transducer's resistance $R_{MR}$ varies with time during normal circuit operation, conventional circuitry for determining the magnitudes of bias potentials $V_{BP}$ and $V_{BN}$ cannot adjust the magnitudes of bias potentials $V_{BP}$ and $V_{BN}$ (in real time) during normal circuit operation to maintain optimized performance despite the varying transducer resistance. It would be desirable to generate a resistance signal indicative of the transducer resistance during normal operation (in addition to the conventional preamplifier output which is indicative of the potential difference across the transducer; not the transducer's resistance). Such a resistance signal could be used as feedback to circuitry for maintaining optimal biasing of the transducer.

It should be appreciated that the conventional preamplifier output (which is indicative of voltage across the transducer; not the transducer' resistance) is indicative only of high frequency components of the voltage across the transducer, since the preamplifier acts as a high pass filter. Such a conventional output signal gives no indication of the d.c. component of the bias voltage for the transducer (or the low frequency components of such bias voltage). To indicate the d.c. bias voltage for the transducer, the standard practice in the prior art is to provide a separate, buffered d.c. output which can be either an analog voltage (indicative of the d.c. bias across the transducer) or the output of an analog-to-digital converter (in response to such an analog voltage). The output of such an analog-to-digital converter can be accessed through a serial port by an external microcontroller running appropriate firmware. It is conventional to employ firmware to deduce the resistance of the transducer by processing a signal indicative of the current through the transducer (usually selected by the firmware through a digital-to-analog converter coupled with the preamplifier), and the buffered d.c. output indicative of d.c. bias voltage across the transducer. However, this prior art technique is cumbersome and inaccurate. It would be desirable to generate a resistance signal indicative (accurately) of the instantaneous value of transducer resistance during normal operation (while the transducer is biased and in the presence of a magnetic field), so that the resistance signal can be used as feedback to circuitry for maintaining optimal biasing of the transducer.

When implementing magnetic disk drive systems (which use a magneto-resistive transducer as read heads), if the disk drive systems do not continuously optimize the d.c. bias voltage for the magneto-resistive transducer in real time, it is possible to make a one-time adjustment to the d.c. bias voltage as a result of determining part-to-part variation in the resistance of magneto-resistive heads. Such an adjustment could be performed during the manufacture of the disk drive system. However, it would be preferable during normal operation of such a disk drive system to monitor the resistance of the transducer and employ feedback to maintain optimal biasing of the transducer.

In resistive transducers other than magneto-resistive transducers, the resistance of the transducer varies in response to a parameter being sensed. As in the case of magneto-resistive transducers, it would often be useful (during preamplification of the potential difference across any of the other types of resistive transducers) to generate a signal indicative of the transducer' resistance (in addition to the preamplifier output which is indicative of the potential difference across the transducer).

SUMMARY OF THE INVENTION

In preferred embodiments, the invention is a preamplifier for a resistive transducer, which is configure d to generate an amplified output signal indicative of high frequency components of the time-varying potential difference across the transducer (while the transducer is biased and in the presence of a magnetic field), and also to generate a resistance signal indicative of the transducer' resistance (while the transducer is biased and in the presence of a magnetic field). The preamplifier preferably includes circuitry for generating a current signal indicative of the instantaneous current through the transducer and analog divider circuitry for generating the resistance signal from the amplified output signal (or other signal indicative of the potential difference across the transducer, including d.c. or low frequency components of this potential difference) and the current signal.

In cases in which the resistance signal is an analog signal, circuitry can be provided for processing the analog resistance signal to generate a word (e.g., byte) of binary data indicative of a value proportional to the transducer resistance (i.e., $KR_{MR}$, where the proportionality constant K has a known value). Alternatively, when the resistance signal is an analog signal the inventive circuit can include a digital-to-analog (D-to-A) converter and comparator (which receives an analog resistance signal and the output of the D-to-A converter). In operation of the latter class of embodiments, the output of the D-to-A converter is swept until the comparator is tripped, at which time the setting of the D-to-A converter is proportional to the transducer resistance.

In other embodiments, the invention is a method for measuring the resistance of a resistive transducer (preferably while generating a signal indicative of potential difference across the transducer) during normal operation of the transducer, while the transducer is biased and in the presence of a magnetic field.

DETAILED DESCRIPTION OF THE INVENTION

A preferred embodiment of the inventive preamplifier circuit will be described initially with reference to FIGS. 2 and 3. The FIG. 2 embodiment is an improved version of the FIG. 1 circuit, which includes amplifier 2 (having inputs coupled to opposite ends of the transducer whose resistance is $R_{MR}$, as does the amplifier of FIG. 1 which comprises transistors $Q_{P1}$, $Q_{P2}$, $Q_{P3}$, and $Q_{P4}$, and current sources 3 and 4) and biasing transistors M1 and M2 as does FIG. 1, and which also includes circuitry for generating resistance signal $V_{OUT}$ (having a value proportional to the resistance $R_{MR}$ of the transducer) The FIG. 2 circuit is coupled between a top rail (at potential $V_{CC}$) and a bottom rail (at potential $V_{EE}$).

Figure 2:
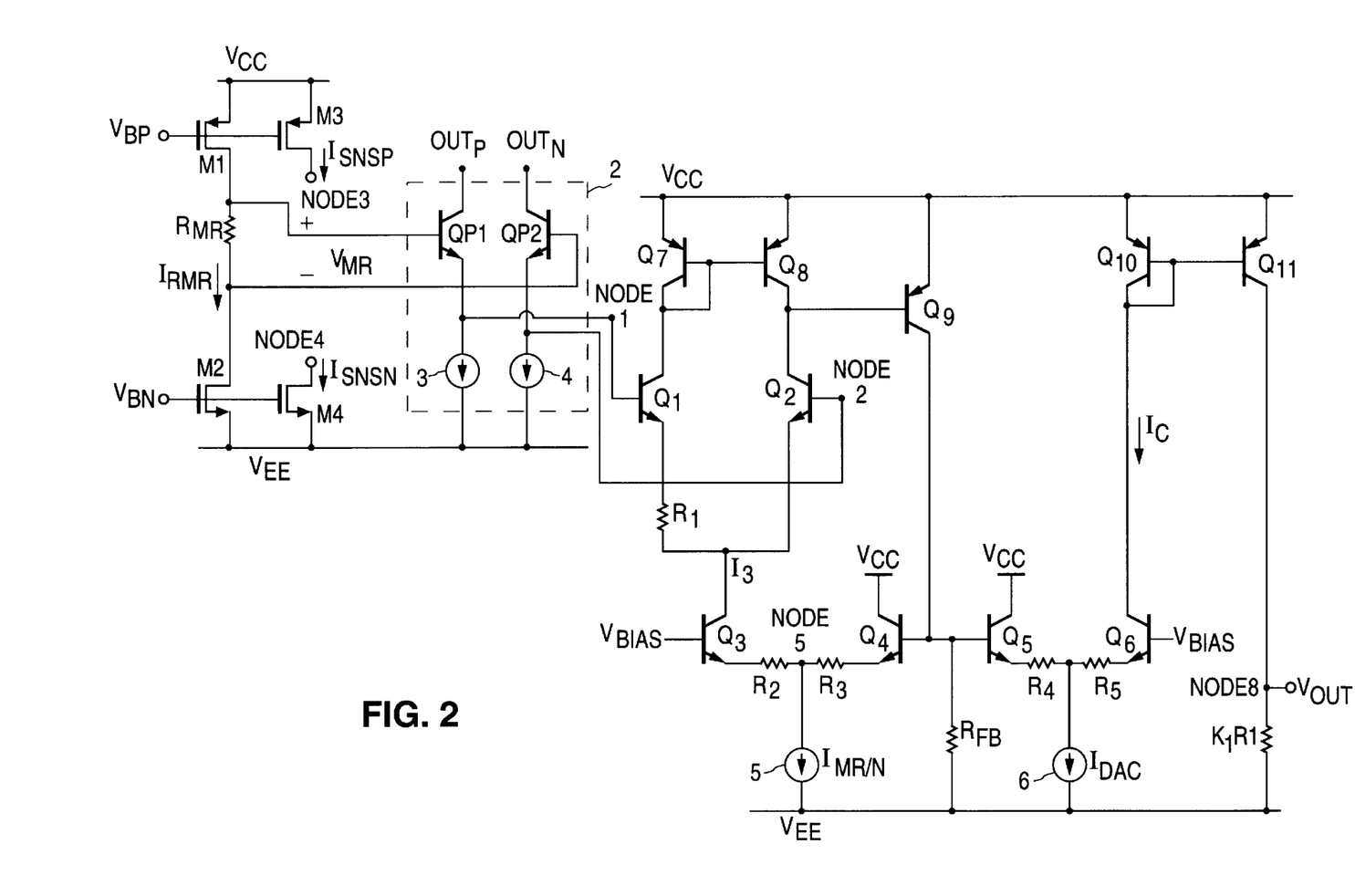
FIG. 2 is a schematic diagram of a preferred embodiment of the inventive circuit, connected to a magneto-resistive transducer. It is contemplated that this circuit will typically be implemented as an integrated circuit or portion of an integrated circuit.

The FIG. 2 embodiment can measure the resistance $R_{MR}$ of the transducer while the transducer is biased by assertion of bias potentials $V_{BP}$ and $V_{BN}$ to the gates of transistors M1 and M2, resulting in a bias potential across the transducer and flow of current $I_{MR}$ through the transducer (and through transistors M1 and M2). The magnitudes of the bias potentials $V_{BP}$ and $V_{BN}$ are chosen as a function of the transducer resistance (e.g., the transducer resistance in the presence of no magnetic field) and other factors to optimize system performance. Preferably, $V_{BP}$ and $V_{BN}$ are controlled to allow the correct current $I_{MR}$ to flow through the transducer while keeping the common mode voltage of the transducer, $(V_{RMRP}+V_{RMRN})/2$, where $V_{RMRP}-V_{RMRN}$ is the voltage across the transducer, at an appropriate level to prevent electrical discharge to the disk (or other object) being sensed and to allow voltage headroom (source-to-drain or collectorto-emitter voltage) for the transistors employed in the circuit. It should be understood that circuitry for generating the bias potentials $V_{BP}$ and $V_{BN}$ for FIG. 2 can readily be implemented using well known principles, including the conventional principles discussed above with reference to FIG. 1A. The resistance signal $V_{OUT}$ output from the FIG. 2 circuit can be used (in a way that will be apparent to those of ordinary skill in the art in view of the present disclosure) to implement circuitry for generating the bias potentials $V_{BP}$ and $V_{BN}$ for FIG. 2.

The FIG. 2 circuit includes analog divider circuitry, coupled between Nodes 1 and 2 (the emitters of transistors $Q_{P1}$ and $Q_{P2}$ of amplifier 2) and output Node 8, which functions to divide a signal indicative of the instantaneous potential difference across the transducer (the potential difference between Nodes 1 and 2) by a signal (proportional to signal $I_{SNSP}$ at Node 3 or signal $I_{SNSN}$ at Node 4) indicative of the instantaneous current ($I_{MR}$) through the transducer. Signal $I_{SNSP}$ or $I_{SNSN}$ is used to implement current source 5, so that current source 5 sinks (from Node 5) a known fraction of the instantaneous current $I_{MR}$ through the transducer. Since only one of signals $I_{SNSP}$ and $I_{SNSN}$ is used, either PMOS transistor M3 or NMOS transistor M4 is preferably omitted. If transistor M3 is omitted, the signal $I_{SNSN}$ (the drain current of transistor M4) is used as the signal indicative of instantaneous current through the transducer. If transistor M4 is omitted, the signal $I_{SNSP}$ (the collector current of transistor M3) is used as the signal indicative of instantaneous current through the transducer.

Since the gates of PMOS transistors M1 and M3 are connected, the ratio of the currents at the drains of these transistors depends on the size ratio of transistors M1 and M3 (and the current $I_{SNSP}$ is proportional to the current $I_{MR}$). Since the gates of NMOS transistors M2 and M4 are connected, the ratio of the currents at the drains of these transistors depends on the size ratio of transistors M2 and M4 (and the current $I_{SNSN}$ is proportional to the current $I_{MR}$).

Figure 3:
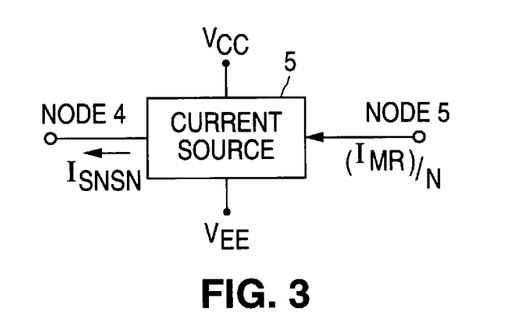
FIG. 3 is a block diagram of an implementation of current source 5 of FIG. 2.

FIG. 3 is a block diagram of an implementation of current source 5 of FIG. 2. In this implementation, current source 5 sinks (from Node 5 of FIG. 2) a known fraction of the current $I_{SNSN}$ (determined by known characteristics of the components of the current source), so that the current sunk from Node 5 is $I_{MR}/N$, where "N" is a known constant and $I_{MR}$ is the instantaneous current through the transducer. In the FIG. 4 embodiment to be discussed below, N preferably has the value N=48. The current source of FIG. 3 preferably corrects for any error currents, such as the base currents of transistors $Q_{P1}$ and $Q_{P2}$ or any error currents resulting from other circuitry coupled to the bases of $Q_{P1}$ and $Q_{P2}$, that may alter the proportionality between $I_{MR}$ and either $I_{SNSP}$ or $I_{SNSN}$ With reference again to FIG. 2, the base of NPN bipolar transistor Q1 is coupled to the emitter of transistor $Q_{P1}$ (Node 1), and the base of NPN bipolar transistor Q2 is coupled to the emitter of transistor $Q_{P2}$ (Node 2). The potential difference between one end of the transducer and Node 1 is $V_{BE}$ of transistor $Q_{P1}$, and the potential difference between the other end of the transducer and Node 2 is $V_{BE}$ of transistor $Q_{P2}$ (so that by choosing $Q_{P1}$ and $Q_{P2}$ to have substantially the same base-to-emitter voltage, the potential difference between Nodes 1 and 2 is substantially equal to the voltage drop $V_{MR}$ across the transducer).

Figure 9:
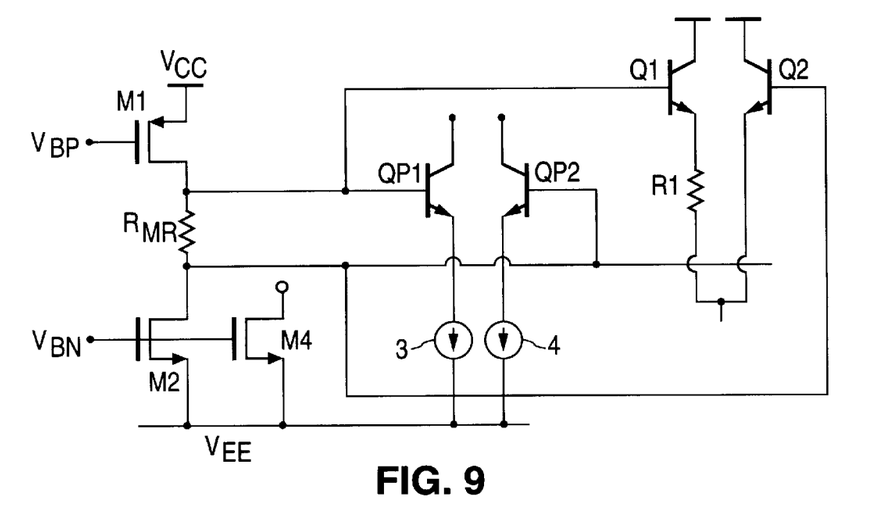
FIG. 9 is a schematic diagram of part of a variation on the FIG. 2 embodiment of the inventive circuit, connected to a magneto-resistive transducer. The remaining portion of this variation has the same structure as does that portion of FIG. 2 other than elements M1, $R_{MR}$, M2, M3, $Q_{P1}$, $Q_{P2}$, 3, 4, Q1, Q2, and R1.

In a variation on the FIG. 2 embodiment (a portion of which is shown in FIG. 9), the bases of transistors Q1 and Q2 are coupled directly to opposite ends of transducer $R_{MR}$ (as are the bases of $Q_{P1}$ and $Q_{P2}$). However, such a configuration requires modification of the conventional interface (embodied in FIG. 1) between the transducer and preamplifier. An advantage of the FIG. 2 design (over that of FIG. 9) is that the conventional implementation of the very sensitive transducer-biasing circuit (elements M1, $R_{MR}$, and M2 connected between the top and bottom rails) need not be modified, except in the minor respect that the gate of one of the biasing transistors M1 and M2 is connected to the base of a transistor (M3 or M4) for generating a signal indicative of the current $I_{MR}$ through the biased transducer.

With reference again to FIG. 2, the emitter of Q1 is coupled through resistor R1 to the collector of NPN bipolar transistor Q3, the emitter of Q2 is coupled to the collector of Q3, the collector of Q1 is coupled to the base and collector of PNP bipolar transistor Q7 and to the base of PNP bipolar transistor Q8, the collector of Q2 is coupled to the collector of Q8 and to the base of PNP bipolar transistor Q9, the collector of Q9 is coupled through resistor $R_{FB}$ to the bottom rail (and to the common bases of PNP transistors Q4 and Q5, the emitter of Q3 is coupled through resistor R2 to Node 5, the emitter of Q4 is coupled through resistor R3 to Node 5, the collector of Q5 is coupled to the top rail, the emitter of Q5 is coupled through resistor R4 to current source 6, the emitter of NPN transistor Q6 is coupled through resistor R5 to current source 6, the base of each of transistors Q3 and Q6 is biased at potential $V_{BIAS}$, the collector of Q6 is coupled to the collector and base of PNP transistor Q10 and to the base of PNP transistor Q11, the emitters of Q9, Q10 and Q11 are coupled to the top rail, the collector of Q11 is coupled to output Node 8, and resistor $K_1R1$ is coupled between Node 8 and the bottom rail. Transistors Q10 and Q11 are a current mirror, in which current $I_C$ (flowing from the collector of Q10 to the collector of Q6) is mirrored so that current $I_c$ flows from the collector of Q11 through resistor $K_1R1$ (to cause the voltage drop across resistor $K_1R1$ to determine the output potential $V_{OUT}$ at Node 8).

The circuitry comprising transistors Q1, Q2, Q3, Q4, Q5, Q6, Q7, Q8, Q9, Q10, and Q11, current sources 5 and 6, and resistors R1, R2, R3, RFB, R4, R5, and $K_1R1$ is an analog divider which divides a signal indicative of the instantaneous potential difference $V_{MR}$ across the transducer (the potential difference between Nodes 1 and 2) by a signal indicative of the instantaneous current through the transducer (a signal proportional to the current, $I_{MR}/N$, sunk from Node 5) to generate output potential $V_{OUT}$ at Node 8 whose amplitude is indicative of the instantaneous resistance of the transducer.

It will be apparent to those of ordinary skill in the art that the current ($I_2$) flowing to the collector of Q2 is identical to the current ($I_1$) flowing to the collector of Q1, and that both currents are equal to $V_{MR}/R1$. The current $I_3$ flowing to the collector of Q3 is $(A)(I_{MR}/N)$, where "A" is a coefficient determined by the loop. The current $I_3$ satisfies $I_3=(A)(I_{MR}/N)=2 V_{MR}/R1$. It follows that $A=2N(R_{MR})/(R1)$. The current $I_C$ flowing to the collector of Q6 is $I_c=(A)(I_{DAC})=2N(R_{MR})(I_{DAC})/(R1)$ The potential $V_{OUT}$ at output Node 8 is $V_{OUT}=(I_C)(K_1R1)=[2N(K_1)(I_{DAC})](R_{MR})$. Thus, since $k_1$ and N are known ($I_{MR}/N$ is the current sunk from Node 5 by current source 5), $V_{OUT}$ determines $R_{MR}$ provided that $I_{DAC}$ is known.

Figure 10:
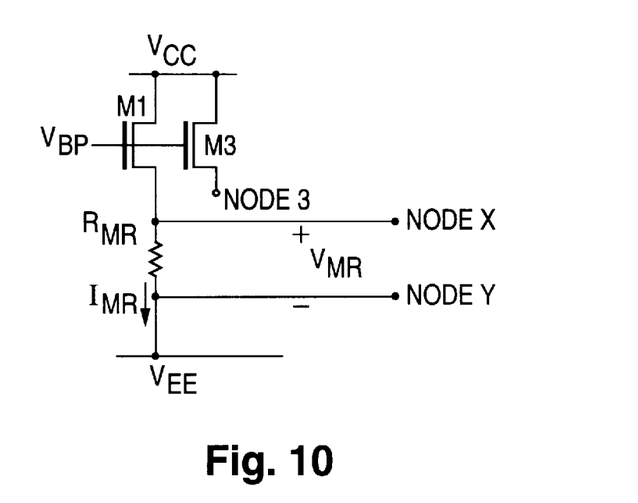
FIG. 10 is a schematic diagram of part of another variation on the FIG. 2 embodiment of the inventive circuit, connected to a magneto-resistive transducer, in which transistors M2 and M4 are omitted and the transducer is connected between transistor M1 and ground.

In variations on the FIG. 2 embodiment, one end of the transducer $R_{MR}$ is grounded (or coupled directly to the top or bottom rail) and the other end of the transducer $R_{MR}$ is coupled to a biased transistor as shown in FIG. 2. For example, in one such variation, transistors M2 and M4 are omitted, and one end of transducer $R_{MR}$ is coupled directly to ground (rather than to the drain of M2). For example, in the variation of FIG. 10, transistors corresponding to transistors M2 and M4 (of FIG. 2) are omitted, and the magnetoresistive transducer is connected between transistor M1 and the bottom rail (at potential $V_{EE}$, which can be ground potential). In the FIG. 10 embodiment, the analog divider can be implemented (in a manner that will be apparent to those of ordinary skill in the art given the present disclosure) more simply than the analog divider of FIG. 2, since only the potential at Node X (at one end of the transducer) is unknown, and the potential at Node X (the other end of the transducer) is known. In the FIG. 10 embodiment, the collector current of transistor M3 is used as the signal indicative of instantaneous current through the transducer.

In other variations on the FIG. 2 embodiment, the analog divider receives as an input a signal (or signal pair) whose potential (or potential difference) is proportional to or a level-shifted version of $V_{MR}$, the voltage across the transducer.

In other variations on the FIG. 2 embodiment, the analog divider is implemented without all or some of resistors R2, R3, R4, and R5. Among the advantages of including resistors R2, R3, R4, and R5 are the following: they make it easier to stabilize the feedback loop, they result in more linear gain, and they result in better performance over a wide range of values of the transducer resistance.

Figure 7:
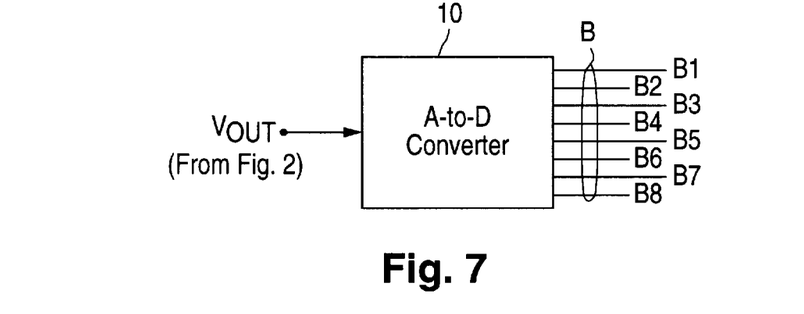
FIG. 7 is a block diagram of analog-to-digital conversion circuitry 10 for processing the output signal ($V_{OUT}$) of the FIG. 2 circuit.

With reference again to FIG. 2, the output signal $V_{OUT}$ (of FIG. 2) is an analog voltage signal whose amplitude is proportional to the transducer resistance, and it can undergo any of a variety of further processing operations. For example, if $I_{DAC}$ is a known reference current, then analog-to-digital conversion circuitry 10 (indicated in FIG. 7) can be coupled to Node 8 of FIG. 2 for processing the signal $V_{OUT}$ to generate byte B of binary data (comprising bits B1–B8) indicative of either the value $R_{MR}$ or the value $[2N(K_1)(I_{DAC})](R_{MR})$.

Alternatively, one input of comparator 20 (indicated in FIG. 8) is coupled to Node 8 of FIG. 2 for comparing the signal $V_{OUT}$ with a reference signal (provided to the other input of comparator 20).

Figure 8:
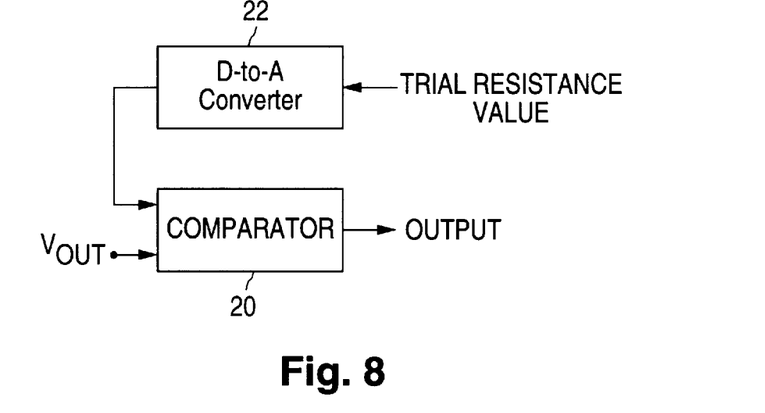
FIG. 8 is a block diagram of circuitry for processing the output signal ($V_{OUT}$) of the FIG. 2 circuit.

If $I_{DAC}$ is a known, fixed reference current, the value of the reference signal is swept to generate an output signal "OUTPUT" (at the output of comparator 20) indicative of a match between a value of the reference signal and the signal $V_{OUT}$. The reference signal (which is an analog voltage) is generated by performing digital-to-analog (D-to-A) conversion in D-to-A converter 22 on the digital signal "TRIAL RESISTANCE VALUE" which comprises binary bits indicative (at any instant of time) of a value $[2N(K_1)(I_{DAC})](R_{TRIAL})$, where $R_{TRIAL}$ is a trial value (e.g., an arbitrarily selected possible value) of the transducer resistance. In operation, the output of D-to-A converter 22 is swept until the comparator output signal ("OUTPUT") indicates that comparator 20 has tripped. The value of the digital signal TRIAL RESISTANCE VALUE at the time comparator 20 trips is equal to $V_{OUT}$ and thus the value of $R_{TRIAL}$ at this time is the transducer resistance. Circuitry can be provided for displaying an indication of this value of $R_{TRIAL}$ or processing a signal indicative of the value of $R_{TRIAL}$ (e.g., in a microcontroller running appropriate firmware) to adjust critical parameters of the pre-amplifier or other circuitry.

Still with reference to FIG. 8, if $I_{DAC}$ is a known (but variable) current, $I_{DAC}$ can be swept (to produce a varying $V_{OUT}$ at a first input of comparator 20) while a fixed reference signal is provided to a second input of comparator 20. The value ($V_{ref}=[2N(K_1)(I_{DAC})](R_{ref})$ of the fixed reference signal (at the second input of comparator 20) at the time the comparator trips is equal to $V_{OUT}$ and thus the value $R_{ref}=V_{ref}/[2N(K_1)(I_{DAC})]$ at this time is the transducer resistance $R_{MR}$. Circuitry can be provided for displaying an indication of this value of $R_{ref}$.

With reference to FIG. 2, resistor $R_{FB}$ can be replaced by a current source. Among the advantages of using resistor $R_{FB}$ (rather than a current source) is that the resistor is simpler and less expensive to implement.

A preferred implementation of the analog divider circuitry of FIG. 2 (the analog divider circuitry coupled between Nodes 1 and 2 and output Node 8 of FIG. 2) will next be described with reference to FIGS. 4–6. Nodes 1, 2, and 5 are identically numbered in FIGS. 2 and 4–6.

Figures 4, 4A:
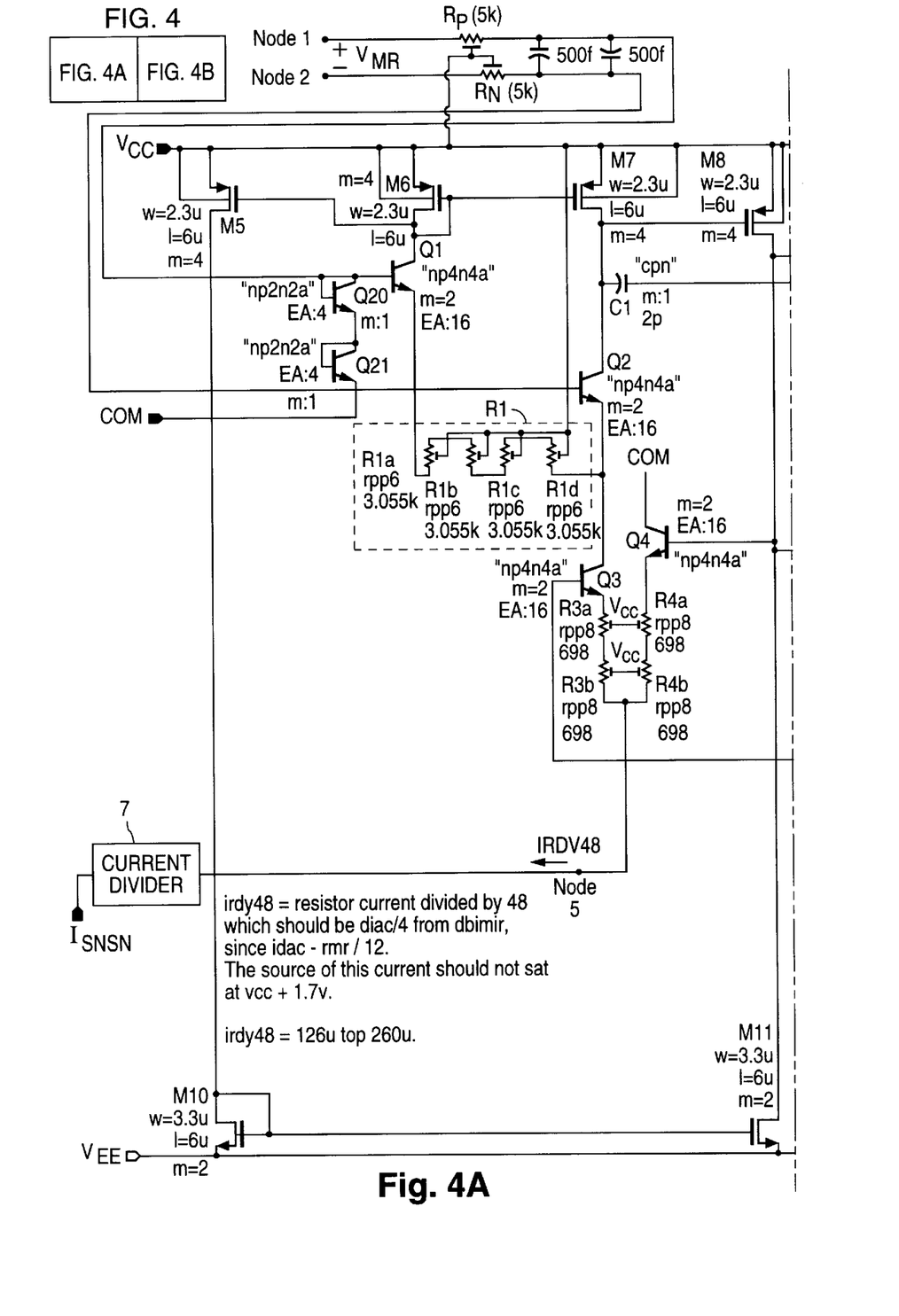
FIG. 4 is a schematic diagram of a first portion of a preferred implementation of a portion of the FIG. 2 circuit, in which the current IRDV48 corresponds to current $(I_{MR})/N$ drawn from Node 5 of FIG. 2.
Figure 4B:
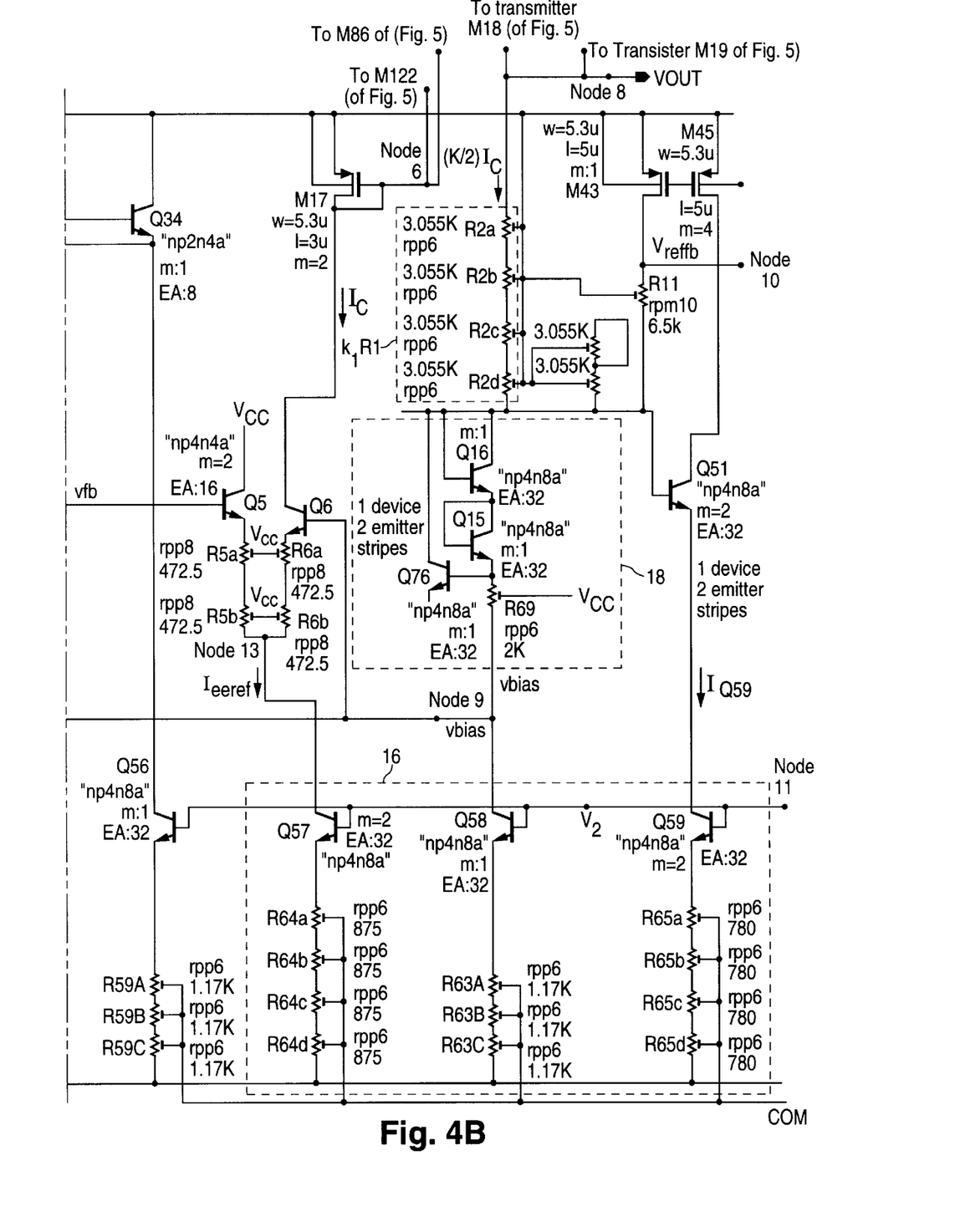

FIG. 4 is a schematic diagram of a first portion of such preferred analog divider implementation, in which the current "IRDV48" corresponds to current $(I_{MR})/N$ drawn from Node 5 of FIG. 2 (with N=48). The FIG. 4 circuit includes current divider 7, whose input is coupled to the drain of transistor M4 of FIG. 2. In a typical implementation of FIG. 2, the current $I_{SNSN}$ flowing (from the input of circuit 7) into the drain of M4 (when transducer $M_{MR}$ is biased for normal operation) is equal to $I_{SNSN}=I_{MR}/12$, and current divider 7 divides this current by four so that the output current IRDV48 of divider 7 has amplitude IRDV48=$I_{MR}/48$.

In variations on the preferred embodiment, the input current to circuit 7 is supplied by an FET transistor which mirrors the current $I_{MR}$ through the biased transducer $R_{MR}$ (optionally with a known scaling factor other than one or four), and circuit 7 is either omitted (replaced by a short circuit) or configured to scale the current it receives by a factor other than twelve) so that the current drawn from Node 5 is the current $I_{MR}$ divided or multiplied by some factor other than 48. In the preferred implementation shown in FIG. 4, circuit 7 should not saturate at $V_{EE}+1.7$ volts.

As explained above, the potential difference between Nodes 1 and 2 of FIG. 4 (and FIG. 2) is equal (or at least substantially equal) to the potential difference $V_{MR}$ across the biased transducer. Node 1 is coupled through resistor $R_p$ (having resistance 5 KOhms in the preferred implementation, as indicated) to the base of Q1 and the base of NPN bipolar transistor Q28 (whose emitter is coupled through diode-connected bipolar transistor Q21 to ground potential "COM"), and Node 2 is coupled through resistor $R_n$ (having resistance 5 KOhms in the preferred implementation, as indicated) to the base of Q2. Resistors R1a, R1b, R1c, and R1d (coupled between the emitters of Q1 and Q2) correspond to resistor R1 of FIG. 2, and have a total resistance of 12.22 KOhms in the preferred implementation. The emitter of Q2 is coupled to the collector of Q3, the emitter of Q3 is coupled to Node 5 through resistors R3a and R3b (corresponding to R3 of FIG. 2), the collector of Q4 is grounded, and the emitter of Q4 is coupled to Node 5 through resistors R4a and R4b (corresponding to R4 of FIG. 2). The sources of PMOS transistors M5, M6, M7, M8, M17, M43, and M45 are coupled to the top rail (at potential $V_{CC}$) and the sources of NMOS transistors M10 and M11 are coupled to the bottom rail. The drain of M5 is coupled to the drain of M10, the drain and gate of M6 are coupled to the collector of Q1, the drain of M7 is coupled to the collector of Q2 and the gate of M8, and the drain of M8 is coupled to the drain of M11.

Transistors M6, M7, and M8 of FIG. 4 correspond respectively to Q7, Q8, and Q9 of FIG. 2. The collector of NPN bipolar transistor Q34 is coupled to the top rail, the emitter of Q34 is coupled to the collector of NPN bipolar transistor Q56, the emitter of Q56 is connected through resistors R59A, R59B, and R59C to the bottom rail, the base of Q56 is biased by $V_2$, and the base of Q34 is coupled to the common bases of Q4 and Q5.

Diode-connected PMOS transistor M17 of FIG. 4 corresponds to transistor Q10 of FIG. 2, the drain of M17 being connected to the collector of Q6. The collector of Q5 is coupled to the top rail, the emitter of Q5 is coupled through resistors R5a and R5b (corresponding to R4 of FIG. 2) to Node 13, and the emitter of Q6 is coupled through resistors R6a and R6b (corresponding to R5 of FIG. 2) to Node 13. Circuit 16 (to be described below, and which corresponds to current source 6 of FIG. 2) sinks constant current $I_{eeref}$ from Node 13.

Circuit 18 (coupled between circuit common and Node 9), and bipolar transistor Q58 and resistors R63A, R63B, and R63C of circuit 16 (coupled between Node 9 and the bottom rail), hold Node 9 at bias potential $V_{bias}$. Thus, the bases of Q3 and Q6 are maintained at bias potential $V_{bias}$.

PMOS transistor M43 and resistor R11 maintain Node 10 of FIG. 4 at reference potential $V_{reffb}$.

Figure 5:
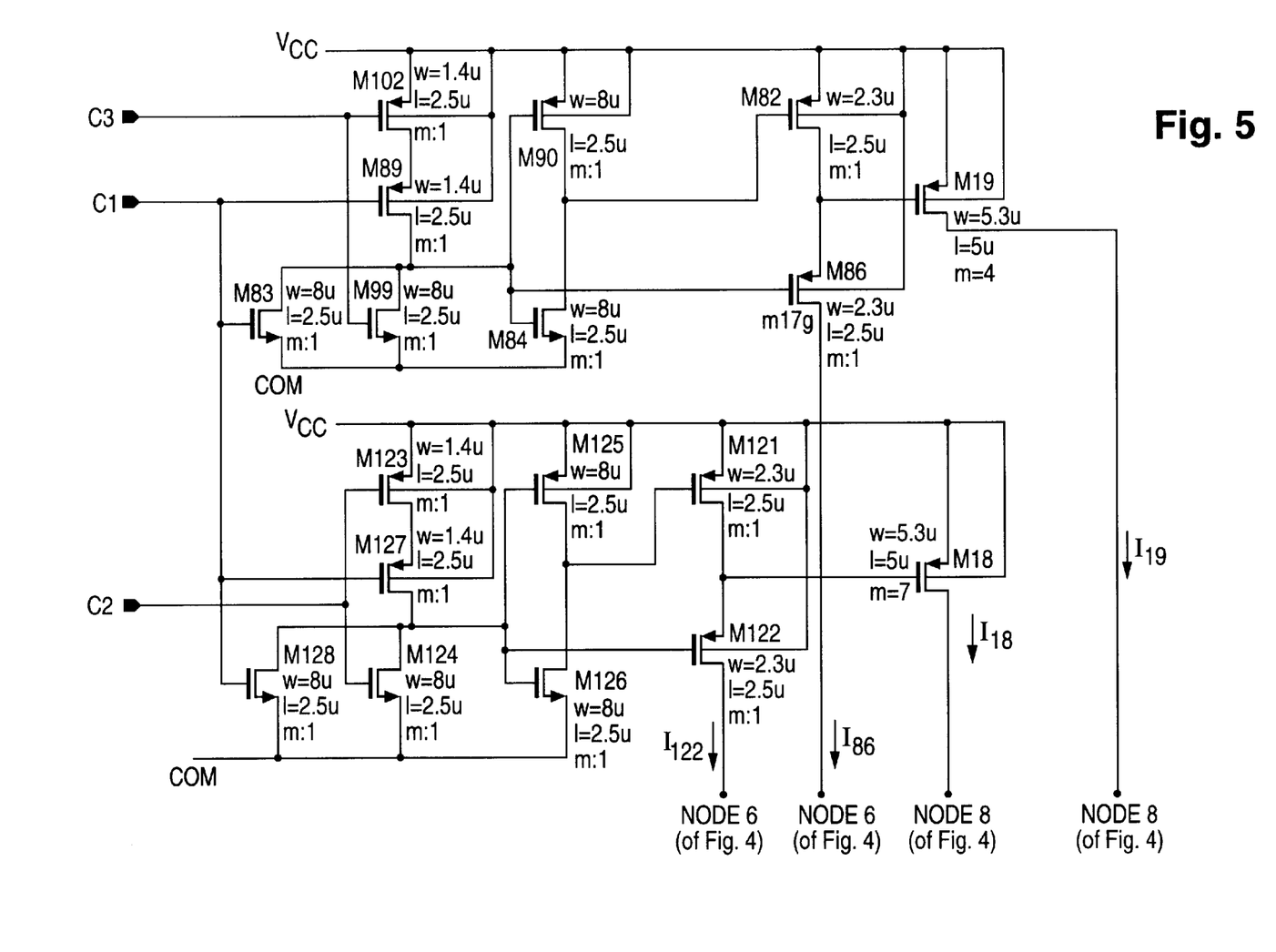
FIG. 5 is a schematic diagram of a second portion of a preferred implementation of the FIG. 2 circuit, which performs the function of transistor Q11 of FIG. 2, and whose nodes labeled Node 6 and Node 8 correspond respectively to the identically labelled nodes of FIG. 4.

With reference to FIG. 5, a portion ($I_{86}$) of the current $I_c$ flowing from Node 6 to transistor Q6 flows from PMOS transistor M86 to Node 6, and another portion ($I_{122}$) of the current $I_c$ flows from PMOS transistor M122 to Node 6. In response, depending on the state of each of binary control signals C1, C2, and C3 (which are asserted with different combinations of values depending on the range of resistances in which the transducer resistance $R_{MR}$ falls).

Transistors M18 and M19 of FIG. 5 correspond functionally to transistor Q11 of FIG. 2 in the following sense (and the other circuitry of FIG. 5 is logic circuitry for selectively turning one or both of M18 and M19 off or on and coupling one or both of M18 and M19 to Node 6 of FIG. 4). In FIG. 2, the current through the collector of Q11 mirrors current $I_c$ through the collector of Q10. In the embodiment of FIGS. 4 and 5, the combined current $(K/2)I_c$ through the channels of PMOS transistors M18 and M19 mirrors (with a selectable scaling factor K/2) the current $I_c$ through the channel of transistor M17. The sizes of devices M17, M18, and M19 are different. Specifically, although the channel length and width characteristics of M17, M18, and M19 are the same ("w"=53 u, and "1"=5 u), the multiplicity ("m") characteristic of each is different (m=2 for transistor M17, m=7 for transistor M18, and m=4 for transistor M19 as indicated).

For example, when C2 is high and C1 and C3 are low, FET transistors M83, M128, M102, M89, M99, M123, M127, M124, M90, M84, M125, and M126 (connected as shown) are respectively off, off, on, on, off, off, on, on, off, on, on, and off, so that PMOS transistor M87 is on, PMOS transistor M86 is off, PMOS transistor M121 is off, and PMOS transistor M122 is on. Thus, M19 is off, the current $I_{18}$ through the channel of M18 is $(7/2)I_c$, and thus the current through resistors R2a, R2b, R2c, and R2d is $I_{18}+I_{19}=(7/2)I_c$.

For another example, when C3 is high and C1 and C2 are low, FET transistors M83, M128, M102, M89, M99, M123, M127, M124, M90, M84, M125, and M126 are respectively off, off, off, on, on, on, on, off, on, off, off, and on, so that PMOS transistor M87 is off, PMOS transistor M86 is on, PMOS transistor M121 is on, and PMOS transistor M122 is off. Thus, M18 is off, the current $I_{19}$ through the channel of M19 is $(4/2)I_c$, and thus the current through resistors R2a, R2b, R2c, and R2d is $I_{18}+I_{19}=(4/2)I_c=2I_c$.

For another example, when C1 is high and C2 and C3 are low, PMOS transistor M87 is off, PMOS transistor M86 is on, PMOS transistor M121 is off, and PMOS transistor M122 is on. Thus, the current $I_{18}$ through the channel of M18 is $(7/2)I_c$, the current $I_{19}$ through the channel of M19 is $(4/2)I_c$, and thus the current through resistors R2a, R2b, R2c, and R2d is $I_{18}+I_{19}=(11/2)I_c$.

Thus, depending on the state of control bits C1–C3, output Node 8 is at potential $V_{OUT}=(N/2)I_c(R2a+R2b+R2c+R2d)$, where N=4, 7, or 11. Since $(R2a+R2b+R2c+R2d)=R1=(R1a+R1b+R1c+R1d)$, and $I_c$ is related by a known proportionality constant to $(V_{MR})/(I_{MR})=R_{MR}$, it follows that $V_{OUT}$ is proportional to $R_{MR}$ (with a known proportionality constant relating $V_{OUT}$ and $R_{MR}$).

Figure 6:
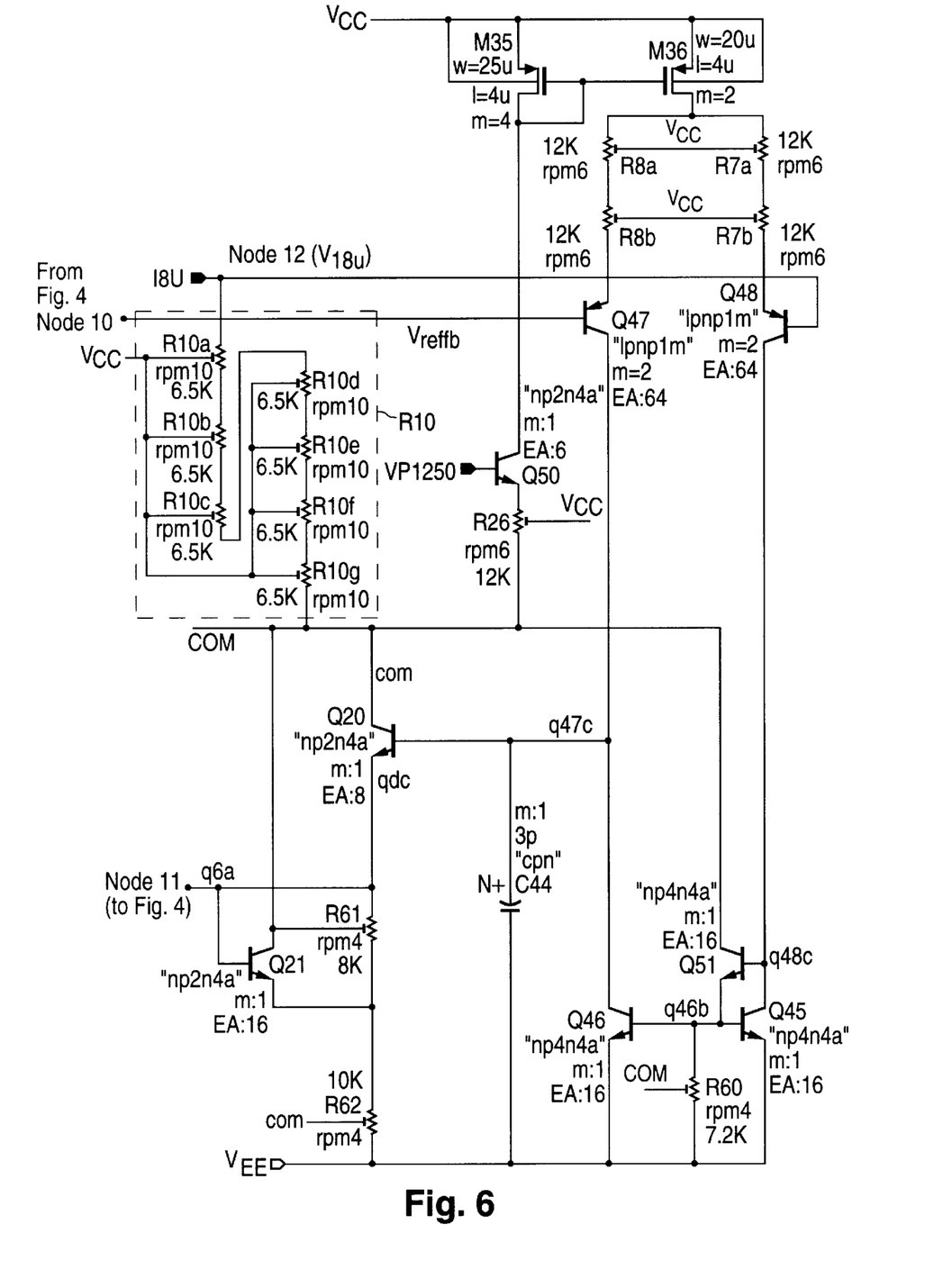
FIG. 6 is a schematic diagram of a third portion of a preferred implementation of the FIG. 2 circuit, whose nodes labeled Node 10 and Node 11 correspond respectively to the identically labelled nodes of FIG. 4.

With reference next to FIG. 6, we next describe op amp circuitry for generating signal $V_2$ (at Node 11 of FIG. 4) for biasing transistors Q57, Q58, and Q59 of circuit 16 of FIG. 4. FIG. 6 is a schematic diagram of such op amp circuitry. The Nodes labeled Node 10 and Node 11 in FIG. 6 correspond to the identically labelled Nodes of FIG. 4. The FIG. 6 circuitry receives reference current I8U (which is an 8 microAmp current in the preferred implementation) at Node 12, and Node 10 (and thus the base of PNP bipolar transistor Q47) is maintained at reference potential $V_{reffb}$. Current I8U flows to ground (at ground potential COM) through resistor R10 (comprising series-connected resistors R10a, R10b, R10c, R10d, R10e, R10f, and R10g), and thus the base of PNP bipolar transistor Q48 (coupled to Node 12) is at potential $V_{I8U}$.

The source of PMOS transistor M36 is coupled to the top rail, the drain and gate of M36 are coupled to the collector of NPN bipolar transistor Q50, the emitter of Q50 is coupled to ground through resistor R26, and Q50 is biased by potential VP1250 which is provided from an external source to its base. The source of PMOS transistor M36 is coupled to the top rail, the drain of M36 is coupled through resistors R8a,R8b and R7a,R7b respectively to the emitters of Q47 and Q48, and the gate of M36 is coupled to the gate of M36 so that the current at the drain of M36 is mirrored to flow at the drain of M36. The collector of Q47 is coupled to the collector of NPN bipolar transistor Q46, the collector of Q48 is coupled to the collector of NPN bipolar transistor Q45, the emitters of Q46 and Q45 are coupled to the bottom rail, and the common bases of Q45 and Q46 are coupled through resistor R60 to the bottom rail. The emitter of NPN bipolar transistor Q51 is coupled to the bases of Q46 and Q45, the collector of Q51 is grounded, and the base of Q51 is coupled to the collector of Q45. The base of NPN bipolar transistor Q20 is coupled to the collector of Q46, the collector of Q20 is grounded, and the emitter of Q20 is coupled through resistors R61 and R62 to the bottom rail. The base of NPN transistor Q21 is coupled to Node 11, the collector of Q21 is grounded, and the emitter of Q21 is connected between resistors R61 and R62.

Thus, the op amp circuitry of FIG. 6 maintains Node 11 at bias potential $V_2$, whose level is chosen to bias transistors Q57, Q58, and Q59 of circuit 16 of FIG. 4 (and transistor Q56) so that circuit 16 operates in the manner described herein.

Within circuit 16, NPN bipolar transistor Q59 is biased (by potential $V_2$ at its base) so that the current $I_{Q59}$ from transistor Q51 into the collector of Q59 is equal to $I_{Q59}=4(R10/R11)(I8U)=32$ microAmps (R10/R11). NPN bipolar transistor Q57 (also connected within circuit 16) is biased (by potential $V_2$ at its base) so that current $I_{eeref}$ from Node 13 into the collector of Q57 is equal to $I_{eeref}=[(R65a+R65b+R65c+R65d)/(R64a+R64b+R64c+R64d)]I_{Q59}=[(R65a+R65b+R65c+R65d)/(R64a+R64b+R64c+R64d)](R10/R11)$ (32 microAmps).

In operation of the embodiment of FIGS. 4–6, assuming that resistors R1a, R1b, R1c, and R1d have a total resistance R1=12.22 KOhms (as indicated in FIG. 4), if the transducer resistance $R_{MR}$ is equal to the nominal value $R_{nom}=63.6$ Ohms, then half of the current IRDV48 flows through transistor Q3 (and resistors R1a, R1b, R1c, and R1d) and the other half through transistor Q4. If transducer resistance $R_{MR}$ increases above $R_{nom}$, then the potential at the base of Q4 drops, less than half of the current IRDV48 flows through transistor Q4, and more than half of the current IRDV48 flows through Q3 and resistors R1a, R1b, R1c, and R1d. Similarly, $I_c$ (from transistor M17 into the collector of transistor Q6) increases, since current $I_{eeref}$ drawn from Node 13 (by circuit 16) remains fixed. As a result, the output potential $V_{OUT}$ at Node 8 increases in proportion to the increase in transducer resistance $R_{MR}$.

In the embodiment of FIGS. 4–6, instead of mirroring the current $I_c$ through M17 (as in FIG. 2, assuming that transistors Q10 and Q11 of FIG. 2 have the same size) so that $I_c$ flows to circuit common through resistors R2a, R2b, R2c, and R2d (which correspond to resistor $K_1R1$ of FIG. 2), current $I_{18}$ (from the drain of M18 and current $I_{19}$ (from the drain of M19) combine to produce scaled current $(N/2)I_c$ which flows through to circuit common through resistors R2a, R2b, R2c, and R2d of FIG. 4. As explained about with reference to FIG. 5, the factor N is selectable by controlling the state of each of control bits C1, C2, and C3.

It should be appreciated that in variations on the described embodiments, PNP bipolar transistors and a current source can replace NPN bipolar transistors and a current sink (e.g., NPN bipolar transistors Q3 and Q4, with current source 5 for sinking current from Node 5, of FIG. 2). In other variations on the described embodiments, FET transistors replace all or some of the bipolar transistors of the described embodiments, and bipolar transistors replace all or some of the FET transistors of the described embodiments. The invention can be implemented with circuitry whose transistors are all FET transistors, or all bipolar transistors, or a combination of FET and bipolar transistors.

Throughout the specification, including in the claims, the terms "connected" and "coupled" are used interchangeably, in a broad sense denoting either a direct electrical connection between the things connected or coupled (with no intermediate devices) or an indirect connection (e.g., through one or more passive or active intermediate devices).

The invention can be implemented by modifying any of the many different conventional architectures for implementing a preamplifier for a magneto-resistive transducer ($R_{MR}$), including the architecture of FIG. 1, to include resistance measurement circuitry including an analog divider in accordance with the invention. In all embodiments, the resistance measurement circuitry receives signals indicative of the current through the biased transducer and the potential at each end of the transducer (or any proportional analog of such signals). In the FIG. 2 embodiment, the resistance measurement circuitry receives signals indicative of current $I_{MR}$ through biased transducer $R_{MR}$ and the potentials at Nodes 1 and 2. In alternative embodiments, the signal indicative of current $I_{MR}$ through the biased transducer can be replaced by a signal indicative of the drain current of transistor M0, M1, or M2 (of FIG. 1A), the voltage across resistor $R_{SETP}$, or the current $I_{DAC-RMR}$, or any other signal proportional to $I_{MR}$ (such as signals generated by current mirrors and sense resistors). Depending on the choice of signal, a correction circuit may be added or subtracted to compensate for the base currents of transistors $Q_{P1}$ and $Q_{P2}$ (or other transistors performing the same or similar function), and/or the current through resistors $R_{DIF1}$ and $R_{DIF2}$ (or other resistors performing the same or similar function).

Preferred embodiments of the invention have been described with reference to FIGS. 2–10. Although these embodiments have been described in some detail, it is contemplated that many changes from (and variations on) these embodiments can be made without departing from the spirit and scope of the invention as defined by the appended claims.

What is claimed is:

1. A circuit for measuring resistance of a resistive transducer while the transducer is biased for normal operation by transducer biasing circuitry, said circuit comprising:

a preamplifier having input terminals, wherein the preamplifier is configured to generate a preamplified signal indicative of potential difference across the transducer when the input terminals are coupled across the transducer and the transducer is biased for normal operation;

transducer current circuitry having at least one input, wherein the transducer current circuitry is configured to generate a first signal having an amplitude indicative of current through the transducer when the at least one input is coupled to the transducer biasing circuitry and the transducer is biased for normal operation; and resistance measurement circuitry having a first input and at least one other input, the first input coupled to receive the first signal, and the at least one other input coupled to receive at least one signal indicative of the potential difference across the transducer when the transducer is biased for normal operation, wherein the resistance measurement circuitry includes analog divider circuitry configured to generate from the first signal and the at least one signal, a third signal indicative of the resistance of the transducer when said transducer is biased for normal operation.

2. The circuit of claim 1, wherein said at least one other input of the resistance measurement circuitry comprises a second input and a third input, the second and third inputs are coupled to receive a second signal indicative of the potential difference across the transducer when the transducer is biased for normal operation, and the analog divider circuitry of the resistance measurement circuitry is configured to generate said third signal from the first signal and the second signal.

3. The circuit of claim 2, wherein the transducer has a first end and a second end, and the preamplifier includes a first bipolar transistor having a base for coupling to the first end of the transducer and a second bipolar transistor having a base for coupling to the second end of the transducer, and wherein the second input of the resistance measurement circuitry is coupled to a channel terminal of the first bipolar transistor and the third input of the resistance measurement circuitry is coupled to a channel terminal of the second bipolar transistor.

4. The circuit of claim 3, wherein the analog divider circuitry of the resistance measurement circuitry includes:

a bipolar transistor having a base and an emitter;

a second bipolar transistor having a base and an emitter, wherein the base of the bipolar transistor and the base of the second bipolar transistor are coupled to receive the second signal, and the emitter of the second bipolar transistor is coupled to a first node;

a resistor coupled between the emitter of the bipolar transistor and the first node;

a second resistor having a first end coupled to a second node and a second end;

a third resistor having a first end coupled to the second node and a second end;

a third bipolar transistor having a collector coupled to the first node, and an emitter coupled to the second end of the second resistor;

a fourth bipolar transistor having an emitter coupled to the second end of the third resistor; and a current source coupled to the second node and to the transducer current circuitry, and configured to sink from the second node a current having amplitude proportional to the amplitude of the first signal.

5. The circuit of claim 3, wherein the analog divider circuitry of the resistance measurement circuitry includes:

a bipolar transistor having a base and an emitter;

a second bipolar transistor having a base and an emitter, wherein the base of the bipolar transistor and the base of the second bipolar transistor are coupled to receive the second signal, and the emitter of the second bipolar transistor is coupled to a first node;

a resistor coupled between the emitter of the bipolar transistor and the first node;

a third bipolar transistor having a collector coupled to the first node, and an emitter coupled to a second node;

a fourth bipolar transistor having an emitter coupled to the second node; and a current source coupled to the second node and to the transducer current circuitry, and configured to sink from the second node a current having amplitude proportional to the amplitude of the first signal.

6. The circuit of claim 2, wherein the transducer has a first end and a second end, the second input of the resistance measurement circuitry is coupled to the first end of the transducer, and the third input of the resistance measurement circuitry is coupled to the second end of the transducer.

7. The circuit of claim 2, wherein the analog divider circuitry of the resistance measurement circuitry includes:

a third bipolar transistor having a base coupled to the channel terminal of the first bipolar transistor and an emitter;

a fourth bipolar transistor having a base coupled to the channel terminal of the second bipolar transistor and an emitter coupled to a first node;

a resistor coupled between the emitter of the third bipolar transistor and the first node;

a second resistor having a first end coupled to a second node and a second end;

a third resistor having a first end coupled to the second node and a second end;

a fifth bipolar transistor having a collector coupled to the first node, and an emitter coupled to the second end of the second resistor;

a sixth bipolar transistor having an emitter coupled to the second end of the third resistor; and a current source coupled to the second node and to the transducer current circuitry, and configured to sink from the second node a current having amplitude proportional to the amplitude of the first signal.

8. The circuit of claim 7, wherein the resistance measurement circuitry also includes:

an op amp having an input coupled to receive a reference current, and an output coupled to the current source, wherein the output of the op amp is at a stable reference potential having value sufficient to cause the current source to sink said current having amplitude proportional to the amplitude of the first signal.

9. The circuit of claim 7, wherein the analog divider circuitry has an output node at which the third signal is asserted, and the third signal is an output potential having amplitude $K(R_{MR})$, where K is a known proportionality constant determined by characteristics of the resistance measurement circuitry, and $R_{MR}$ is the resistance of the transducer when said transducer is biased for normal operation, and wherein the resistance measurement circuitry also includes:

logic circuitry coupled to the output node and having inputs coupled to receive control signals, wherein the logic circuitry is configured to change the output potential at the output node in response to changes in the control signals, in such a manner as to vary the known proportionality constant K in response to said changes in the control signals.

10. A system, comprising:

a resistive transducer;

biasing circuitry coupled to the transducer and configured to bias the transducer for normal operation;

a preamplifier having input terminals coupled across the transducer, wherein the preamplifier is configured to generate a preamplified signal indicative of potential difference across the transducer when the transducer is biased for normal operation;

transducer current circuitry having at least one input coupled to the biasing circuitry, wherein the transducer current circuitry is configured to generate a first signal having an amplitude indicative of current through the transducer when the transducer is biased for normal operation; and resistance measurement circuitry having a first input and at least one other input, the first input coupled to receive the first signal, and the at least one other input coupled to receive at least one signal indicative of the potential difference across the transducer when the transducer is biased for normal operation, wherein the resistance measurement circuitry includes analog divider circuitry configured to generate from the first signal and the at least one signal, a third signal indicative of the resistance of the transducer when said transducer is biased for normal operation.

11. The system of claim 10, wherein said at least one other input of the resistance measurement circuitry comprises a second input and a third input, the second and third inputs are coupled to receive a second signal indicative of the potential difference across the transducer when the transducer is biased for normal operation, and the analog divider circuitry of the resistance measurement circuitry is configured to generate said third signal from the first signal and the second signal.

12. The system of claim 11, wherein the analog divider circuitry of the resistance measurement circuitry includes:

a bipolar transistor having a base and an emitter;

a second bipolar transistor having a base and an emitter, wherein the base of the bipolar transistor and the base of the second bipolar transistor are coupled to receive the second signal, and the emitter of the second bipolar transistor is coupled to a first node;

a resistor coupled between the emitter of the bipolar transistor and the first node;

a second resistor having a first end coupled to a second node and a second end;

a third resistor having a first end coupled to the second node and a second end;

a third bipolar transistor having a collector coupled to the first node, and an emitter coupled to the second end of the second resistor;

a fourth bipolar transistor having an emitter coupled to the second end of the third resistor; and a current source coupled to the second node and to the transducer current circuitry, and configured to sink from the second node a current having amplitude proportional to the amplitude of the first signal.

13. The system of claim 11, wherein the analog divider circuitry of the resistance measurement circuitry includes:

a bipolar transistor having a base and an emitter;

a second bipolar transistor having a base and an emitter, wherein the base of the bipolar transistor and the base of the second bipolar transistor are coupled to receive the second signal, and the emitter of the second bipolar transistor is coupled to a first node;

a resistor coupled between the emitter of the bipolar transistor and the first node;

a third bipolar transistor having a collector coupled to the first node, and an emitter coupled to a second node;

a fourth bipolar transistor having an emitter coupled to the second node; and a current source coupled to the second node and to the transducer current circuitry, and configured to sink from the second node a current having amplitude proportional to the amplitude of the first signal.

14. The system of claim 11, wherein the transducer has a first end and a second end, the second input of the resistance measurement circuitry is coupled to the first end of the transducer, and the third input of the resistance measurement circuitry is coupled to the second end of the transducer.

15. The system of claim 11, wherein the transducer has a first end and a second end, and the preamplifier includes a first bipolar transistor having a base coupled to the first end of the transducer and a second bipolar transistor having a base coupled to the second end of the transducer, and wherein the second input of the resistance measurement circuitry is coupled to a collector terminal of the first bipolar transistor and the third input of the resistance measurement circuitry is coupled to a collector terminal of the second bipolar transistor.

16. The system of claim 15, wherein the analog divider circuitry of the resistance measurement circuitry includes:

a third bipolar transistor having a base coupled to the collector terminal of the first bipolar transistor and an emitter;

a fourth bipolar transistor having a base coupled to the collector terminal of the second bipolar transistor and an emitter coupled to a first node;

a resistor coupled between the emitter of the third bipolar transistor and the first node;

a second resistor having a first end coupled to a second node and a second end;

a third resistor having a first end coupled to the second node and a second end;

a fifth bipolar transistor having a collector coupled to the first node, and an emitter coupled to the second end of the second resistor;

a sixth bipolar transistor having an emitter coupled to the second end of the third resistor; and a current source coupled to the second node and to the transducer current circuitry, and configured to sink from the second node a current having amplitude proportional to the amplitude of the first signal.

17. The system of claim 16, wherein the resistance measurement circuitry also includes:

an op amp having an input coupled to receive a reference current, and an output coupled to the current source, wherein the output of the op amp is at a stable reference potential having value sufficient to cause the current source to sink said current having amplitude proportional to the amplitude of the first signal.

18. The system of claim 16, wherein the analog divider circuitry has an output node at which the third signal is asserted, and the third signal is an output potential having amplitude $K(R_{MR})$, where K is a known proportionality constant determined by characteristics of the resistance measurement circuitry, and $R_{MR}$ is the resistance of the transducer when said transducer is biased for normal operation, and wherein the resistance measurement circuitry also includes:

logic circuitry coupled to the output node and having inputs coupled to receive control signals, wherein the logic circuitry is configured to change the output potential at the output node in response to changes in the control signals, in such a manner as to vary the known proportionality constant K in response to said changes in the control signals.

19. A method for measuring resistance of a resistive transducer while the transducer is biased for normal operation, and while generating a preamplified signal indicative of potential difference across the transducer when the transducer is biased for normal operation, said method including the steps of:

(a) generating a first signal having an amplitude indicative of current through the transducer when the transducer is biased for normal operation;

(b) generating a second signal indicative of the potential difference across the transducer when the transducer is biased for normal operation; and (c) performing analog division on the first signal and the second signal to generate a third signal indicative of the resistance of the transducer when said transducer is biased for normal operation.

20. The method of claim 19, wherein the transducer has a first end and a second end, and the preamplified signal is generated by operating a preamplifier including a first bipolar transistor having a base coupled to the first end of the transducer and a second bipolar transistor having a base for coupled the second end of the transducer, and wherein step (b) includes the step of:

coupling a base of a third bipolar transistor to a collector terminal of the first bipolar transistor while coupling a base of a fourth bipolar transistor to a collector terminal of the second bipolar transistor.

21. The method of claim 20, wherein the transducer has a first end and a second end, and the second signal is generated by coupling an input of a resistance measurement circuit to the first end of the transducer, and coupling a second input of the resistance measurement circuit to the second end of the transducer.

22. The method of claim 19, wherein the third signal is an output potential having amplitude $K(R_{MR})$ and which is asserted at an output node, where K is a known proportionality constant determined by characteristics of resistance measurement circuitry used to generate said third signal, and $R_{MR}$ is the resistance of the transducer when said transducer is biased for normal operation, wherein step (c) includes the step of:

coupling logic circuitry to the output node and asserting control signals to the logic circuitry to configure the logic circuitry to change the output potential at the output node in response to the control signals, in such a manner as to vary the known proportionality constant K.

23. The method of claim 19, also including the steps of:

(d) providing the third signal to a first input of a comparator;

(e) while performing step (d), sweeping a reference signal at a second input of the comparator to generate a comparator output signal indicative of a match between a value of the reference signal and the comparator output signal.

24. The method of claim 23, wherein the third signal is an analog voltage having amplitude $K(R_{MR})$, and the reference signal is an analog voltage generated by performing digital-to-analog conversion on an input signal comprising binary bits indicative of a value $K(R_{TRIAL})$, where $R_{TRIAL}$ is a trial value of the transducer's resistance.

25. The method of claim 19, also including the steps of:

(d) asserting a fixed reference signal at a first input of a comparator;

(e) while performing step (d), asserting the third signal to a second input of the comparator and sweeping a parameter of a resistance measurement circuit employed to generate said third signal to generate a comparator output signal indicative of a match between a value of the fixed reference signal and a value of the third signal.

26. The method of claim 25, wherein the third signal is an analog voltage having amplitude $K(R_X)$, the reference signal is an analog voltage having amplitude $K(R_Y)$, and the match between the value of the fixed reference signal and the value of the third signal occurs when $R_X=R_Y$.

* * * * *